(12) United States Patent
Yogev et al.

(10) Patent No.: US 12,424,294 B2
(45) Date of Patent: Sep. 23, 2025

(54) ONE-TIME PROGRAMMABLE (ROTP) NVM

(71) Applicant: Infineon Technologies LLC, San Jose, CA (US)

(72) Inventors: Yoav Yogev, Mazkeret-Batia (IL); Amichai Givant, Rosh-HaAin (IL); Yair Sofer, Tel-Aviv (IL); Yi He, Fremont, CA (US)

(73) Assignee: Infineon Technologies LLC, San Jose, CA (US)

( * ) Notice: Subject to any disclaimer, the term of this patent is extended or adjusted under 35 U.S.C. 154(b) by 381 days.

(21) Appl. No.: 17/937,012

(22) Filed: Sep. 30, 2022

(65) Prior Publication Data

US 2023/0395171 A1    Dec. 7, 2023

Related U.S. Application Data

(60) Provisional application No. 63/349,227, filed on Jun. 6, 2022.

(51) Int. Cl.
*G11C 17/18*  (2006.01)
*G11C 17/16*  (2006.01)
*G11C 29/34*  (2006.01)

(52) U.S. Cl.
CPC .............. *G11C 17/18* (2013.01); *G11C 17/16* (2013.01); *G11C 29/34* (2013.01)

(58) Field of Classification Search
CPC ................................................ G11C 17/14–18
See application file for complete search history.

(56) References Cited

U.S. PATENT DOCUMENTS

| 9,009,492 B2 | 4/2015 | Belenky et al. |
| 9,293,227 B1 | 3/2016 | Takasugi |
| 2010/0220517 A1 | 9/2010 | Okayama |
| 2022/0101934 A1 | 3/2022 | Sanjeevarao et al. |

OTHER PUBLICATIONS

Chen, Nick, The Benefits of Antifuse OTP', Semiconductor Engineering Deep Insights for the Tech Industry, https://semiengineering.com/the-benefits-of-antifuse-otp, Dec. 19, 2016, 12 pages.

*Primary Examiner* — Alfredo Bermudez Lozada
(74) *Attorney, Agent, or Firm* — Slater Matsil, LLP (57) ABSTRACT

In an embodiment, a method includes: receiving a first program bit address associated with a plurality of redundant bit addresses and a first transistor-based memory cell, where the plurality of redundant bit addresses are each associated with a respective transistor-based memory cell; providing a programing pulse to a first word line coupled to the first transistor-based memory cell to write a first write value to the first transistor-based memory cell; reading a first bit value from the first transistor-based memory cell; reading redundant bit values from transistor-based memory cells associated with the plurality of redundant bit addresses; when one of the first bit value and the redundant bit values do not match the first write value, determining a majority bit value based on the first bit value and on the redundant bit values; and asserting a flag signal when the majority bit value does not match the first write value.

24 Claims, 5 Drawing Sheets

ONE-TIME PROGRAMMABLE (ROTP) NVM

CROSS-REFERENCE TO RELATED APPLICATIONS

This application claims the benefit of U.S. Provisional Application No. 63/349,227, entitled "Fuse Replacement by Real One Time Programing (ROTP) NVM," and filed on Jun. 6, 2022, which application is hereby incorporated herein by reference.

TECHNICAL FIELD

The present disclosure relates generally to an electronic system and method, and, in particular embodiments, to a one-time programmable (OTP) non-volatile memory (NVM).

BACKGROUND

One-time programmable (OTP) memories are commonly used in integrated circuits (ICs) to store immutable data. An OTP memory is a type of memory that may be written but cannot be erased. An OTP memory may be implemented as an OTP by decision or as an OTP by design.

An OTP memory implemented as an OTP by decision is capable, by design, to perform an erase operation, but the erase operation prevented by software. Thus, an OTP memory implemented as an OTP by decision may be programmed and erased during testing, and the erase operation may be disabled during normal operation.

An OTP memory implemented as an OTP by design (also referred to as a real OTP, or ROTP) is an OTP memory that is not capable, by design, of performing an erase operation. An example of an ROTP is a fuse array.

Secure systems, such as a secure microcontroller, typically require an ROTP array, e.g., to store sensitive data. A conventional approach to implement such ROTP array is to use a fuse array. For example, a secure system may include an OTP array that includes a fuse array, where each fuse of the fuse array corresponds to a bit of the OTP array.

A popular fuse for implementing a fuse array is the so-called poly fuse. The poly fuse is typically fabricated with a conductive trace across two terminals. A programing operation is implemented by injecting a high current to the poly fuse, which cause the conductive trace to melt and results in a non-conductive state between the two terminals. By checking whether the poly fuse is conductive or non-conductive, it is possible to determine whether the bit stored in the poly fuse is a logic 1 (e.g., short) or a logic 0 (e.g., open).

Once the poly fuse is non-conductive, the operation cannot be reversed (cannot transform a non-conductive trace into a conductive trace. Therefore, after programming a poly fuse, an erase operation is not possible.

SUMMARY

In accordance with an embodiment, a method of operating a memory may include: receiving a first program bit address, the first program bit address associated with a first plurality of redundant bit addresses, wherein the first program bit address is associated with a first transistor-based memory cell, and wherein the first plurality of redundant bit addresses are each associated with a respective transistor-based memory cell; providing a programing pulse to a first word line coupled to the first transistor-based memory cell to write a first write value to the first transistor-based memory cell; reading a first bit value from the first transistor-based memory cell via a first bit line; reading redundant bit values from transistor-based memory cells associated with the first plurality of redundant bit addresses via respective bit lines; when one of the first bit value and the redundant bit values do not match the first write value, determining a majority bit value based on the first bit value and on the redundant bit values read from the transistor-based memory cells associated with the first plurality of redundant bit addresses; and when the majority bit value does not match the first write value, asserting a flag signal indicative of a failed programing of the first program bit address to the first write value. In accordance with an embodiment, a circuit may include: a plurality of transistor-based memory cells arranged in rows and columns, each transistor-based memory cell comprising first and second bit line terminals coupled to associated bit lines of a plurality of bit lines, and a gate terminal coupled to an associated word line of a plurality of word lines, wherein each word line of the plurality of word lines is coupled to the gate terminals of the transistor-based memory cells of an associated row; and a controller configure to: cause a programing pulse to be provided to a first word line coupled to a first transistor-based memory cell of the plurality of transistor-based memory cells to write a first write value to the first transistor-based memory cell, cause a first bit value to be read from the first transistor-based memory cell via a first bit line, cause redundant bit values to be read from redundant transistor-based memory cells of the plurality of transistor-based memory cells, wherein the redundant transistor-based memory cells are configured to store the same value as the first transistor-based memory cell, when one of the first bit value and the redundant bit values do not match the first write value, determine a majority bit value based on the first bit value and the redundant bit values read from the redundant transistor-based memory cells, and when the majority bit value does not match the first write value, cause a flag signal indicative of a failed programing of the first transistor-based memory cell to the first write value to be asserted.

In accordance with an embodiment, a non-volatile memory may include: a one-time programmable (OTP) sector comprising a first plurality of transistor-based memory cells arranged in rows and columns, each transistor-based memory cell of the first plurality of transistor-based memory cells comprising first and second bit line terminals coupled to associated bit lines of a first plurality of bit lines, and a gate terminal coupled to an associated word line of a first plurality of word lines; and a non-OTP sector comprising a second plurality of transistor-based memory cells arranged in rows and columns, each transistor-based memory cell of the second plurality of transistor-based memory cells comprising first and second bit line terminals coupled to associated bit lines of a second plurality of bit lines, and a gate terminal coupled to an associated word line of a second plurality of word lines; wherein the second plurality of word lines is configured to receive a first positive voltage during a read mode, a second positive voltage during a write mode, and a first negative voltage during an erase mode; wherein the first plurality of word lines is configured to receive a third positive voltage during a read mode, and a fourth positive voltage during a write mode, wherein the first plurality of word lines is designed to not receive a negative voltage during any mode; and wherein the transistor-based memory cells of the OTP sector and the transistor-based memory cells of the non-OTP sector are of the same type.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in specific contexts, e.g., an OTP array implemented with NOR-based multi-bit memory cells, e.g., as part of a bigger NVM that includes non-OTP bits, and, e.g., as part of a secure system, such as a secured SoC, such as a secure microcontroller or a secured stand-alone memory (e.g., including OTP and non-OTP portions). Embodiments of the present invention may be implemented with other types of transistor-based memory cells, such as NAND-based memory cells and/or single-bit memory cells. Some embodiments may be implemented as stand-alone OTP memories. Some embodiments may be implemented in non-secure ICs.

The physical size of a fuse, such as a poly fuse, is relatively big (e.g., about 10 $\mu m^2$), and some fabrication node technologies may not include a design for a fuse cell.

In an embodiment of the present invention, an OTP array is implemented with transistor-based memory cells, such as NOR memory cells. Data immutability is achieved in the OTP array by preventing (e.g., by design) the application of an erase pulse, (e.g., physically preventing the application of a negative voltage to the gate of the memory cell). Using transistor-based memory cells to implement an OTP array may advantageously result in a smaller OTP implementation (e.g., more than moo times smaller than a fuse array of similar size) and may advantageously allow fabrication node technologies that lack a design for a fuse cell to implement an OTP array.

Figure 1:
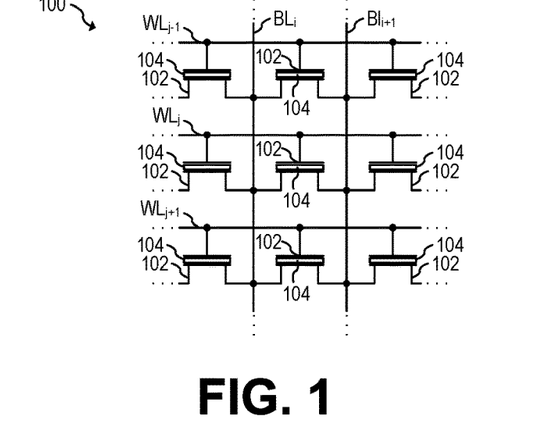
FIG. 1 illustrates a portion of a transistor-based memory cell array, according to an embodiment of the present invention.

FIG. 1 illustrates a portion of transistor-based (non-OTP) memory cell array 100, according to an embodiment of the present invention. Memory cell array 100 includes a plurality of non-volatile memory cells 102 arranged in rows and columns. As shown in FIG. 1, each memory cell 102 has two conduction terminals, each coupled to a respective bit line BL, and a control terminal coupled to a word line WL. In some embodiments, such as in embodiments implementing memory cells 102 as multi-bit memory cells, the two bit lines (e.g., $BL_i$ and $BL_{i+1}$) connected to the terminals of a memory cell 102 may operate as a drain line and source line respectively, during read operation, and as source line and drain line, respectively, during a program operation. Thus, in some embodiments, each bit line BL may act as a source line or as a drain line depending on the operating mode, and depending on which cell 102, and in some embodiments which bit within cell 102, is being read/written (e.g., to the left of the bit line BL or to the right of the bit line BL). In other embodiments, such as in some embodiments implementing memory cells 102 as single bit memory cells, the two bit lines (e.g., $BL_i$ and $BL_{i+1}$) connected to the terminals of a memory cell 102 may operate as a source line and drain line, respectively, irrespectively of the mode of operation (e.g., during read or write).

The description below refers to cell $102_{i,j}$, which has a control terminal coupled to word line $WL_j$, a left terminal coupled to bit line $BL_i$, and a right terminal coupled to bit line $BL_{i+1}$.

During a read operation, the gate of memory cell 102 may be biased (e.g., using the associated word line $WL_j$) with a positive voltage (e.g., 5 V), the bit line $BL_{i+1}$ of the memory cell 102 may be biased with a small positive voltage (e.g., 1.5 V), and the bit line $BL_i$ may be biased with a low voltage, such as ground. In another embodiment, during a read operation, voltage biased of bit line $BL_i$ and $BL_{i+1}$ may be reversed. To determine the value stored in memory cell 102, a sense amplifier (not shown) coupled to the respective bit line BL compares in a known manner the current flowing through the respective bit line BL with a current threshold; a current lower than the threshold corresponds to a first state or a programmed state (e.g., assigned logic 0) and a current higher than the threshold corresponds to a second state or an erased state (e.g., assigned logic 1). In an alternative embodiment, the assigned logic values ("0" and "1") may be reversed.

In some embodiments, e.g., to mitigate aging resulting from multiple programing of the memory cell 102, the current threshold adaptively changes to track aging changes.

During a program (write) operation, the gate of memory cell 102 may be biased (e.g., using the associated word line $WL_j$) with a higher positive voltage (e.g., 9 V), the bit line $BL_i$ may be biased with a higher positive voltage (e.g., 5 V), and the bit line $BL_{i+1}$, may be at a lower voltage (e.g., between 0 V and 2 V). Under such conditions, memory cell 102 is programed into the first state (e.g., logic 0). In another embodiment, voltage bias of bit line $BL_i$ and $BL_i+$, may be reversed to program memory cell 102 to the first state.

During an erase operation, the gate of memory cell 102 may be biased (e.g., using the associated word line $WL_j$) with a negative voltage (e.g., −7 V), the bit line $BL_i$ may be biased with a positive voltage (e.g., 5 V), and the bit line $BL_i+$, may be left floating or biased to a weak positive voltage (e.g. lower than 5V). Under such conditions, memory cell 102 is erased into the second state (e.g., logic 1). In another embodiment, voltage bias of bit line $BL_i$ and $BL_{i+1}$ may be reversed to erase memory cell 102 to the second state.

In some embodiments, the voltages applied to the gate, drain, and source of a memory cell 102 for reading, programing, and erasing of the memory cell 102 may vary depending on the particular fabrication node and design.

In some embodiments, each memory cell 102 includes charge trapping material 104 to store one or more bits. For example, in some embodiments, charge trapping material 104 includes a non-conductive material, such as silicon nitride, and is capable of storing 2 bits per memory cell 102. An example of such multi-bit memory cell is the Mirror-Bit™ memory devices/arrays manufactured by Infineon Technologies. In some embodiments, each memory cell 102 stores a single bit. Other implementations are also possible.

Although only 9 memory cells 102 are shown in FIG. 1, it is understood that memory cell array 100 may include more than 9 memory cells 102, such as hundreds, thousands, or millions (or more) of memory cells 102.

Figure 2:
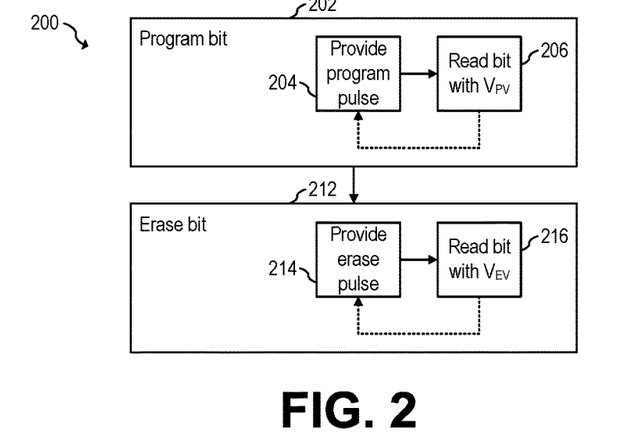
FIG. 2 shows a flow chart of an embodiment method for testing the memory cell array of FIG. 1, according to an embodiment of the present invention.

FIG. 2 shows a flow chart of embodiment method 200 for testing memory cell array 100, according to an embodiment of the present invention. Method 200 may be performed for each memory cell 102 of memory cell array 100.

Figure 3:
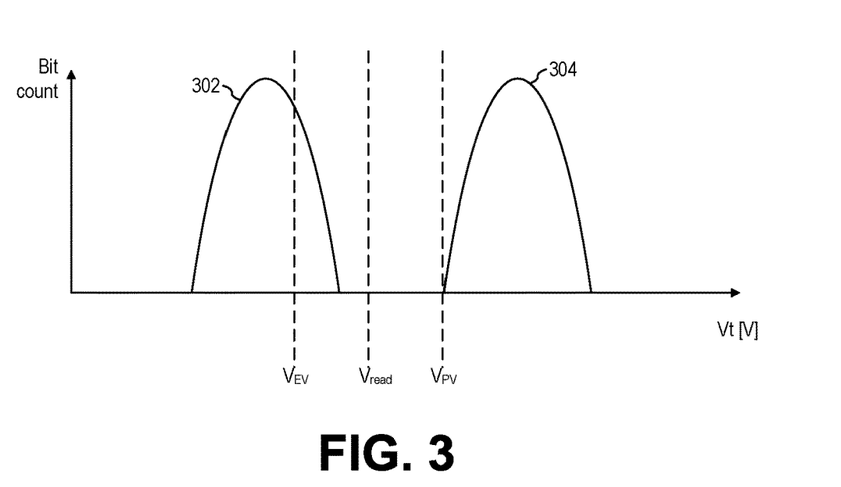
FIG. 3 illustrates voltages associated with the memory cell array of FIG. 1, as well as distributions of the memory cells of FIG. 1 in the first and second states, according to an embodiment of the present invention.

During step 202, a memory cell 102 is programed to the first state (e.g., logic 0). For example, in some embodiments, a program pulse is provided during step 204 (e.g., gate voltage at 9 V, the voltage at bit line $BL_i$ is set to high positive voltage (e.g., 3 V to 5 V), and the voltage at bit line $BL_{i+1}$ is set to a lower voltage (e.g., 0 V to 2 V). A program-verify voltage $V_{PV}$ is used as the gate voltage to perform the read operation during step 206, where the voltage $V_{PV}$ is higher in magnitude than the operational read voltage $V_{read}$ applied to the gate of memory cell 102 during a read operation, as best shown in FIG. 3. If the program verification fails, the voltage at the bit line $BL_i$ is set to the voltage for the next pulse (e.g., an increased voltage or the same voltage) and a new programing pulse is provided until the memory cell 102 is verified as successfully programed (or until the maximum number of attempts is reached and the memory cell 102 is labeled as not working).

After performing step 202, the memory cell 102 is erased to the second state (e.g., logic 1) during step 212. For example, in some embodiments, an erase pulse is provided during step 214 (e.g., gate voltage at −7 V, voltage at $BL_i$ at 5 V, and float $BL_{i+1}$ or bias BLi+1 at a voltage lower than 5V). An erase-verify voltage $V_{EV}$ is used as the gate voltage to perform the read operation during step 216, where the voltage $V_{EV}$ is lower in magnitude than the operational read voltage $V_{read}$, as best shown in FIG. 3. If the erase verification fails, the voltage at the bit line $BL_i$ is set for the next pulse (e.g., increases or remains the same) and a new erase pulse is provided until the memory cell 102 is verified as successfully erased (or until the maximum number of attempts is reached and the memory cell 102 is labeled as not working).

In other embodiments, voltage bias of BL1 and BLi+1 may be reversed during the program, erase, verify read operations in method 200.

In some embodiments, step 202 may be performed for programing data into memory cells 102 during normal operation. Similarly, in some embodiments, step 212 may be performed for erasing data from memory cells 102 during normal operation.

FIG. 3 illustrates voltages $V_{EV}$, $V_{read}$, and $V_{PV}$, as well as distribution of memory cells 102 in the first (304) and second (302) states, according to an embodiment of the present invention.

In some embodiments, the native distribution of memory cells 102 (out of the fab) is represented by curve 302. Even though a, e.g., significant number of memory cells 102 initially fail the first read-verify operation (step 216), as can be seen from curve 302 (with a significant number of memory cells 102 natively above voltage $V_{EV}$), such memory cells 102 are successfully erased during step 212 after a few iterations of steps 214 and 216.

As also shown in FIG. 3, the gate voltage $V_{read}$ applied to a memory cell 102 during a read operation is between the erase-verify voltage $V_{EV}$ and the program-verify voltage $V_{PV}$, thereby exhibit a safety margin to prevent incorrect reads.

Figure 4:
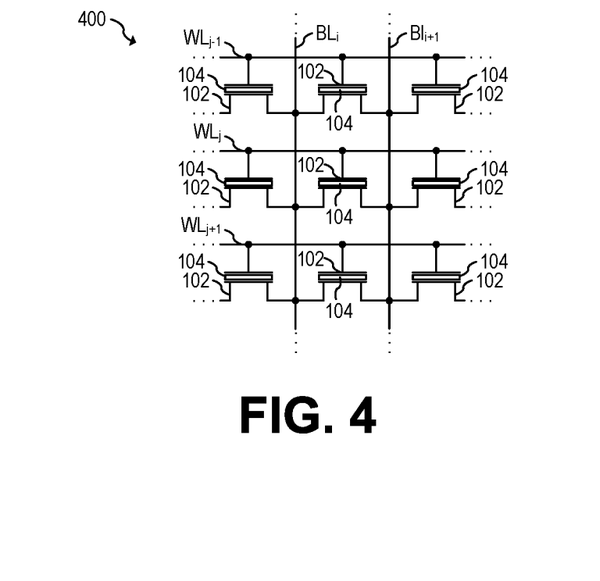
FIG. 4 illustrates a portion of a transistor-based OTP memory cell array, according to an embodiment of the present invention.

As shown in FIGS. 1 and 2, memory cell array 100 can be erased and thus is not an OTP memory cell array. FIG. 4 illustrates transistor-based OTP memory cell array 400, according to an embodiment of the present invention. Memory cell array 400 includes a plurality of non-volatile memory cells 102 arranged in rows and columns. As can be seen in FIGS. 1 and 4, OTP memory cell array 400 may be implemented in a similar manner as memory cell array 100, and may operate in a similar manner as memory cell array 100. OTP memory cell array 400, however, cannot receive negative voltages in the word lines WL, and thus, cannot be erased (step 212 cannot be performed). Thus, memory cell array 400 is an ROTP. As a result, method 200 cannot be applied to OTP memory cell array 400 (since, once all of the memory cells 102 of OTP memory cell array 400 are programed for test purposes, the memory cells 102 of OTP memory cell array 400 cannot be erased, and thus cannot be used to store other data).

In an embodiment of the present invention, during a read operation of a memory cell 102 of OTP memory cell array 400, an OTP read voltage $V_{read\_OTP}$ is applied to the gate of the memory cell 102, where the OTP read voltage $V_{read\_OTP}$ is higher than the read voltage $V_{read}$ applied to the gate of a memory cell 102 of memory cell array 100 during a read operation. By using, for OTP memory cell array 400, a read voltage $V_{read\_OTP}$ that is higher than the read voltage used for memory cell array 100, some embodiments successfully use the native distribution of the memory cells 102 (without erasing the memory cells 102 during testing), during normal operation.

In some embodiments, to program a memory cell 102 of OTP memory cell array 400, step 202 may be performed using an OTP program-verify voltage $V_{PV\_OTP}$ that is higher than the program-verify voltage $V_{PV}$ used to program memory cells 102 of memory cell array 100.

Figure 5:
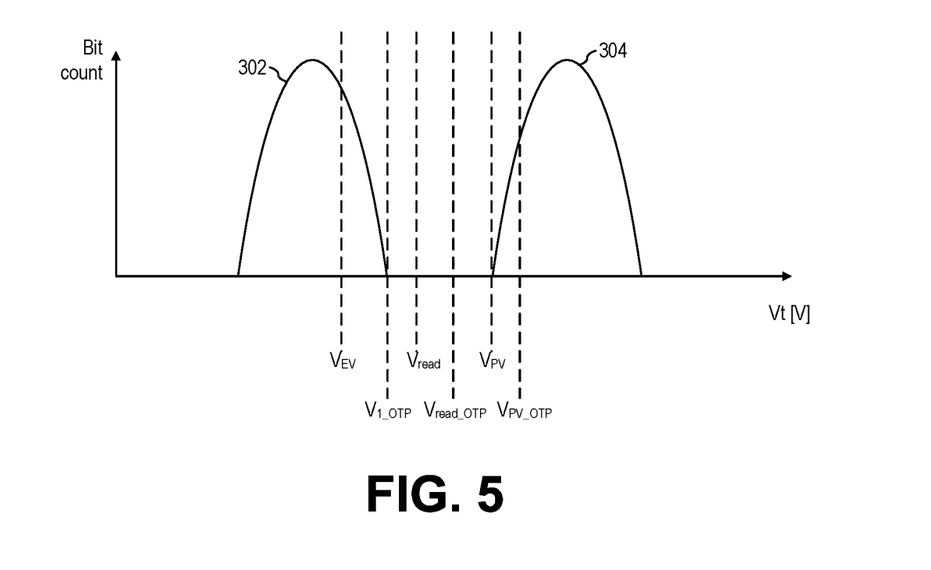
FIG. 5 illustrates voltages associated with the memory cell array of FIG. 4, as well as distributions of the memory cells of FIG. 4 in the first and second states, according to an embodiment of the present invention.

FIG. 5 illustrates voltages $V_{read\_OTP}$, and $V_{PV\_OTP}$, as well as distribution of memory cells 102 in the first (304) and second (302) states, according to an embodiment of the present invention. As illustrated in FIG. 5, voltage $V_{read\_OTP}$ is higher than voltage $V_{read}$ and may be equidistant from voltage $V_{1\_OTP}$ (representing the upper limit of native distribution 302) and voltage $V_{PV\_OTP}$, thereby advantageously providing a safety margin to prevent incorrect reads.

In some embodiments, a portion of the OTP array is programed during testing. By sacrificing a (e.g., relatively small) portion of the OTP array, some embodiments advantageously test programmability of the OTP array and access to the OTP array. For example, in some embodiments, a portion of OTP memory cell array 400 is programed (e.g., to the first state) to test access to all word lines and bit lines. By sacrificing a portion of OTP memory cell array 400, some embodiments advantageously verify that all bit lines and word lines of the OTP memory cell array 400 have proper connectivity and are capable of carrying the desired currents/voltages.

Figure 6:
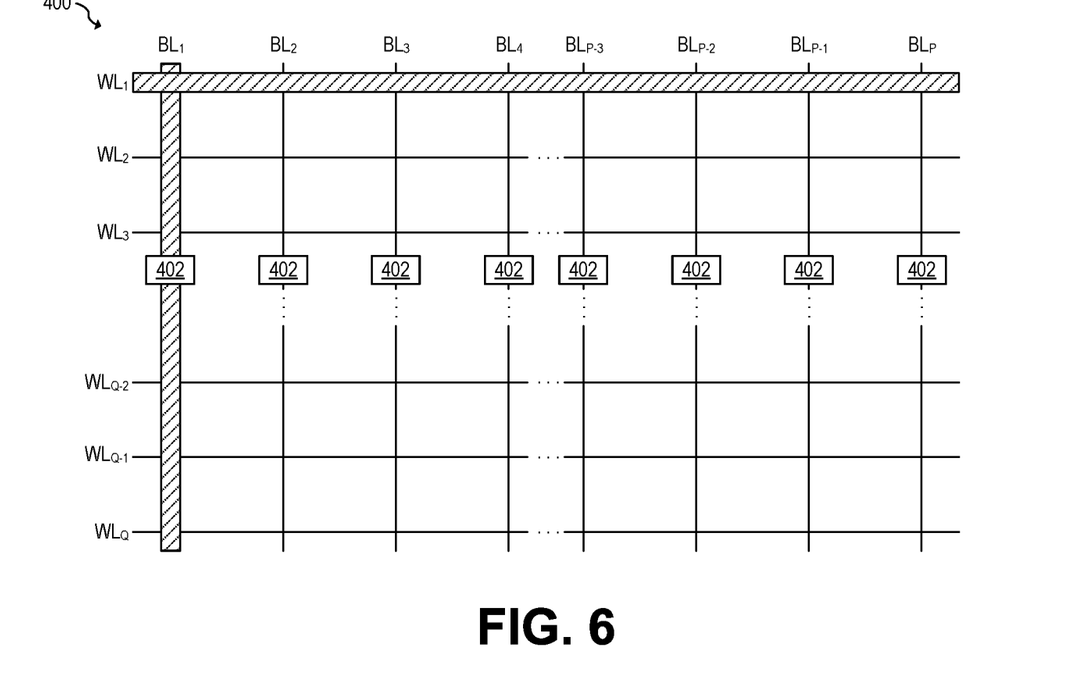
FIG. 6 illustrate a simplified top view of a layout of the OTP memory cell array of FIG. 4, according to an embodiment of the present invention.

FIG. 6 illustrate a simplified top view of a layout of OTP memory cell array 400, according to an embodiment of the present invention.

As shown in FIG. 6, OTP memory cell array 400 has P bit lines BL and Q word lines WL. In some embodiments, P may be equal to 1024 or lower and Q may be between 128 and 512. Other values may also be used.

During testing of OTP memory cell array 400, all memory cells 102 associated with one word line (e.g., $WL_1$) and one bit line (e.g., $BL_1$) or cache line (e.g., CL1) are programed (e.g., using step 202, e.g., using $V_{read\_OTP}$ and $V_{PV\_OTP}$ instead of $V_{read}$ and $V_{PV}$). If all the sacrificed memory cells are programed successfully, the testing of OTP memory cell array 400 is deemed successful since the connectivity paths to all word lines WL and all bit lines BL is verified.

In some embodiments, sacrificing one row and one column of OTP memory cell array 400 advantageously represents a small portion of the total capacity of OTP memory cell array 400 in exchange for an indication that connectivity paths to all word lines WL and bit lines BL is proper. For example, in an embodiment in which P is equal to 128 and Q is equal to 1024, 1,151 memory cells are sacrificed out of 131,072 memory cells of OTP memory cell array 400 during the testing of OTP memory cell array 400.

In some embodiments, more than one column and/or more than one row of memory cells 102 are sacrificed during the testing of OTP memory cell array 400.

In some embodiments, it is possible that outlier memory cells 102 of OTP memory array 400 have a Vt voltage associated with the second state that is higher the $V_{1\_OTP}$. It is thus possible that some memory cell 102 of OTP memory array 400 when read with an OTP read voltage $V_{read\_OTP}$, result in a read of a logic 0 (first state) even though they have never been programmed.

In some embodiments, outlier memory cells 102 may be more likely to be found around locations 402, which represent the locations of the vias connecting metal bit lines with buried bit lines. In some embodiments, memory cells 102 near (e.g., directly adjacent) to the locations 402 (e.g., coupled to the word line WL that is physically closest to locations 402) are not used (sacrificed, such as never programed and/or never read during normal operation), which may advantageously increase the reliability of OTP memory cell array 400. In some embodiments, multiple locations 402 are found, e.g., with a physical periodicity, on each bit line BL (i.e., many locations 402 per bit line BL).

In some embodiments, preventing a read operation to sacrificed memory cells 102 may be performed by software, such as by making sacrificed memory cells 102 non-addressable.

In an embodiment of the present invention, data is stored in the OTP memory cell array 400 with redundancy, and majority voting is used while reading the OTP memory cell array 400 to determine the data stored in OTP memory cell array 400. By using redundancy and majority voting, some embodiments are advantageously capable of reliably using an OTP memory cell array 400 with some defective or outlier memory cells 102 (e.g., associated with fabrication process defects) and without performing method 200 to test the memory cells 102 of the OTP memory cell array 400.

In some embodiments, triple redundancy is used, on a per bit basis, for data stored in OTP memory cell array 400. For example, in some embodiments, the same bit is stored in 3 different memory cells 102. In some embodiments, e.g., to enhance immunity to cluster defects, the same bit is stored in 3 physically distant memory cells 102 (e.g., associated with different word lines WL and different bit lines BL that are physically distanced apart). For example, in some embodiments, each of the bits are stored in locations associated with word lines and bit lines that are not physically adjacent. For example, in some embodiments, the 3 redundant bits associated with a single bit of data are stored in the memory cells 102 associated with WL=1, BL=1; WL=3, BL=3; and WL=5, BL=5, respectively.

Figure 7:
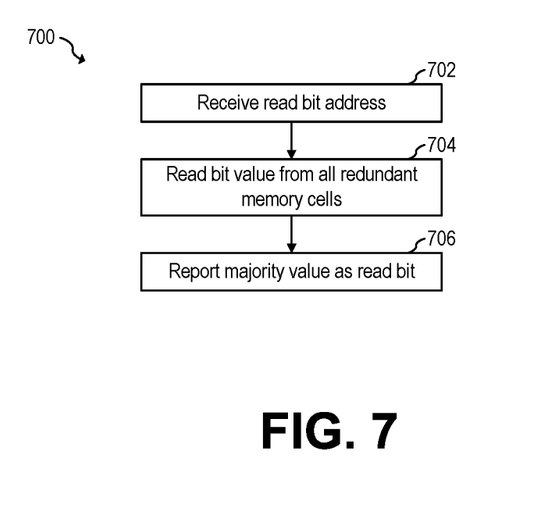
FIG. 7 shows a flow chart of an embodiment method for reading a bit from the OTP memory cell array of FIG. 4, according to an embodiment of the present invention.

In some embodiments, reading a bit from OTP memory cell array 400 includes using majority voting. FIG. 7 shows a flow chart of embodiment method 700 for reading a bit from OTP memory cell array 400 using majority voting, according to an embodiment of the present invention.

During step 702, an address associated with a bit to be read is received.

During step 704, the values from all redundant locations is read. For example, in an embodiment using triple redundancy, values from each of the 3 redundant memory cells 102. In some embodiments, reading the value of each bit includes using the read voltage $V_{read\_OTP}$, and comparing the resulting current from the associated bit line BL with a current threshold, where currents above the current threshold are interpreted, e.g., as logic 0 and currents below the current threshold are interpreted, e.g., as logic 1.

In some embodiments, since memory cells 102 of OTP memory cell array 400 are not subjected to multiple programing cycles, the current threshold used during step 704 is fixed and does not change over time (e.g., does not track aging).

During step 706, the reporting of the bit read is performed according to majority voting. For example, in some embodiments, reading a bit from OTP memory cell array 400 includes reading from the 3 redundant locations (during step 704) and reporting (during step 706) as the read bit the state that receives the most votes. For example, if all of the 3 bits are read as logic 0, the read bit is reported as logic 0. If 2 bits are read as logic 0 and 1 bit is read as logic 1, the read bit is reported as logic 0. If 2 bits are read as logic 1 and 1 bit is read as logic 0, the read bit is reported as logic 1. If all of the 3 bits are read as logic 1, the read bit is reported as logic 1.

In some embodiments, an error correcting code (ECC) is used to detect and correct errors. For example, in some embodiments, the ECC used is capable of correcting one or more errors to the read values (e.g., to a cluster of values read, such as 128 bits). In some such embodiments, step 706 may be performed before performing the ECC step. In some embodiments, step 706 may be performed after performing the ECC step.

Figure 8:
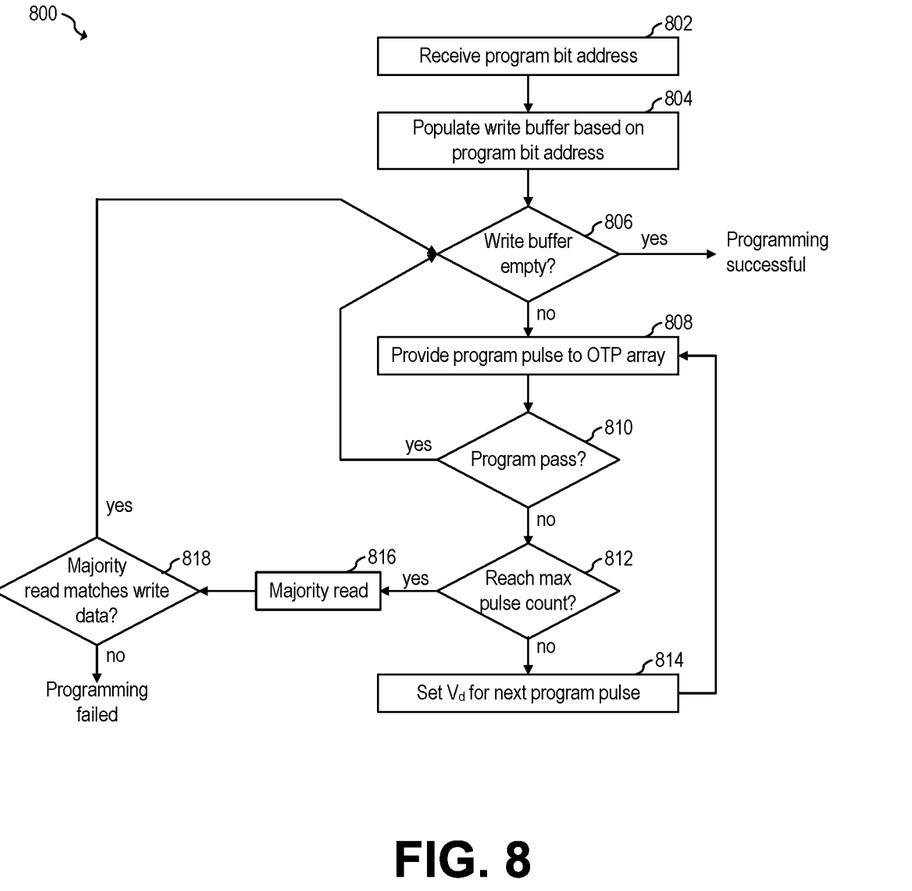
FIG. 8 shows a flow chart of an embodiment method for programing data to the OTP memory cell array of FIG. 4, according to an embodiment of the present invention.

FIG. 8 shows a flow chart of embodiment method 800 for programing data to OTP memory cell array 400, according to an embodiment of the present invention. In some embodiments, method 800 may be performed, e.g., on the field.

During step 802, the address of the bit(s) to be programed to the first state (e.g., logic 0) is(are) received. In some embodiments, only the address of the bit(s) expected to be in the first state (e.g., logic 0), and not the address bit(s) expected to be in the second state (e.g., logic 1) are received during step 802 (since the associated memory cells 102 are expected to already be in the second state from the fab).

During step 804, a write buffer is populated with all bits to be programed to the first state. In some embodiments, the write buffer includes all redundant bit addresses associated with the bit to be programed. In some embodiments, the write buffer includes additional bit addresses (e.g., of other bits to be programed, along with their respective redundant bit addresses).

As illustrated by steps 806, 808, 810, 812, 814, 816, and 818, an attempt is made to program each of the bits stored in the write buffer until all bits are programed (output "yes" from step 806) or until a bit fails to program (output "no" from step 818). For purposes of this description, it is assumed that write buffer includes M bits.

During step 808, a program pulse is provided to OTP memory cell array 400 to attempt to program the kth bit of the write buffer (k being a number between 1 and M). In some embodiments, step 202 is performed as part of step 808 OTP program-verify voltage $V_{PV\_OTP}$ instead of $V_{PV}$.

In some embodiments, multiple bits (e.g., from the write buffer) are programed simultaneously with the same programing pulse during step 808. For example, in some embodiments, all redundant bits associated with the kth bit are programed during the same programing pulse during step 808.

During step 810, it is determined whether the programing of the kth bit was successful. For example, during step 810, bit kth is read (e.g., using read voltage $V_{read\_OTP}$). If the read bit matches the bit written into the kth bit during step 808, then the output of step 810 is "yes." Otherwise, the output of step 810 is "no."

If the output of step 810 is "yes," step 806 is performed. Otherwise, if the output of step 810 is "no," and if the number of attempts to program the kth bit is lower than the maximum number of attempts (determined during step 812), the drain voltage of the memory cell 102 associated with the kth bit is set for the next program pulse during step 814. For example, in some embodiments, the drain voltage V d is raised (e.g., by a predetermined amount) (e.g., if the maximum drain voltage has not been reached), or is kept the same (e.g., if the maximum drain voltage has been reached) during step 814. After step 814, a new programing pulse is provided during step 808.

Otherwise, if the maximum number of programing attempts have been reached for the kth bit (output "yes" from step 812), no more attempts to program the kth bit are made and step 816 is performed.

During step 816, a majority read is performed (e.g., using method 700). Step 816 is performed once all redundant bits associated with a particular bit address received during step 802 are attempted to be programed. If the result from the majority read matches the value written (e.g., logic 0), step 806 is performed. Otherwise (output "no" from step 818), then the programing fails. In some embodiments, a signal is asserted when the programing fails, e.g., to indicate that the programing failed. In some embodiments, such signal is provided, e.g., to an external controller.

In some embodiments, bit-redundancy and majority-voting may advantageously increase the reliability of the transistor-based OTP, and may advantageously enable the reliable use of an OTP array with process defects memory cells 102.

In some embodiments, memory cell array 100 may be programed (e.g., during step 202) using method 800 omitting steps 816 and 818 (i.e., when the output of step 812 is "yes," the programing fails) and using $V_{PV}$ and $V_{read}$ instead of $V_{PV\_OTP}$ and $V_{read\_OTP}$.

Figure 9:
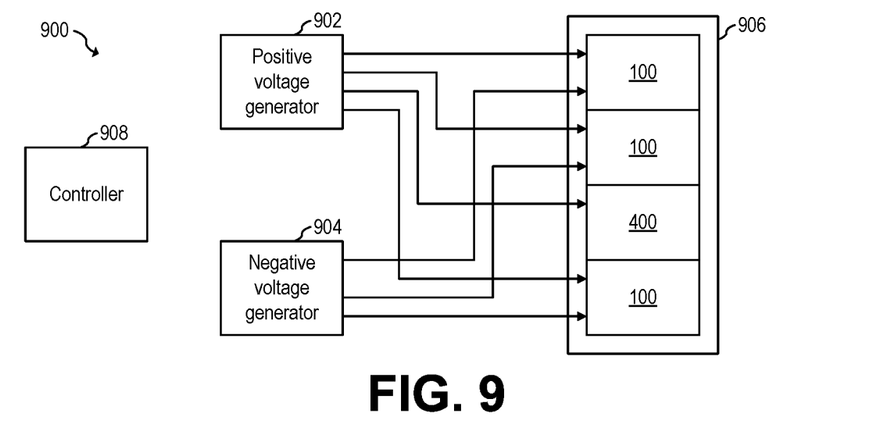
FIG. 9 shows a schematic diagram of a secured integrated circuit (IC), according to an embodiment of the present invention.

FIG. 9 shows a schematic diagram of secured IC 900, according to an embodiment of the present invention. IC 900 includes positive voltage generator 902, negative voltage generator 904, controller 908, and internal memory 906. Internal memory 906 includes a plurality of memory sectors. Some of the memory sectors may be implemented with respective memory cell arrays 100, and other memory sectors may be implemented with OTP memory cell array 400.

As illustrated in FIG. 9, each of the memory sectors implemented with memory cell array 100 is capable of receiving positive and negative voltages from positive voltage generator 902 and negative voltage generator 904, respectively, to be provided to word lines WLs, e.g., during writing, erasing, and reading operations.

As also shown in FIG. 9, none of the memory sectors implemented with OTP memory cell array 400 is capable of receiving a negative voltage from negative voltage generator 904. As a result, OTP memory cell array 400 does not receive a bipolar supply and is physically not capable (by design) of performing an erase operation.

In some embodiments, a read operation of one of the non-OTP sectors implemented with memory array 100 is performed using read voltage $V_{read}$ (e.g., provided by positive voltage generator 902) in the associated word line WL, and using a current threshold to determine the state of the associated memory cell 102 (e.g., logic 0 or logic 1) that is adaptive and changes to track aging of the memory cell while a read operation of one of the OTP sectors implemented with memory array 400 is performed using read voltage $V_{read\_OTP}$ (e.g., provided by positive voltage generator 902 and higher than $V_{read}$), and using a current threshold to determine the state of the associated memory cell 102 (e.g., logic 0 or logic 1) that is fixed and does not change over time.

In some embodiments, a write operation of one of the non-OTP sectors implemented with memory array 100 is performed using voltage $V_{PV}$ (e.g., provided by positive voltage generator 902) in the associated word line WL, while a write operation of one of the OTP sectors implemented with memory array 400 is performed using voltage $V_{PV\_OTP}$ (e.g., provided by positive voltage generator 902 and higher than $V_{PV}$).

In some embodiments, voltage generators 902 and 904 may be implemented in any way known in the art.

In some embodiments, internal memory 906 includes one or more OTP sectors (each implemented with an OTP memory cell array 400) and one or more non-OTP NVM (each implemented with memory cell array 100). In some embodiments, internal memory 906 includes one or more OTP sectors and no non-OTP NVM sectors.

In some embodiments, each of the memory cells 102 of OTP sector(s) and non-OTP sector(s) are implemented as a single bit memory cell.

In some embodiments, each of the memory cells 102 of OTP sector(s) and non-OTP sectors are implemented as a multi bit memory cell. For example, in some embodiments, each of the memory cells 102 of OTP sectors and non-OTP sectors are implemented as a 2-bit memory cell, such as a MirrorBit™, where a read operation of the first or second bit of the 2-bit memory cell is performed by swapping the drain and source of the memory cell 102 in a known manner.

In some embodiments implementing memory cells 102 of the OTP sector(s) with multi-bit memory cells (e.g., of the MirrorBit™ type), all bits of the multi-bit cell are programed (or not programed) to have the same value, which may advantageously increase the reliability of the OTP memory cell as the currents associated with the logic 0 and logic 1 may be further apart compared to when mixed values (e.g., one logic 0 and one logic 1) are stored in the same multi-bit memory cell. In some such embodiments, the bits of each of the memory cells 102 of the non-OTP sector(s) may be treated as independent bits and, thus, may have different values.

In some embodiments implementing memory cells 102 of the OTP sector with multi-bit memory cells (e.g., of the MirrorBit™ type), each bit of the multi-bit memory cell is treated as an independent bit, and thus, may have a different value than the other bit(s) of the same multi-bit memory cell, which may advantageously result in increased memory capacity of the OTP sector.

In some embodiments, controller 908 is configured to perform or cause to be performed the programing, erasing, and reading operations for the non-OTP memory sectors of IC 900, and the programing and reading operations for the OTP memory sectors of IC 900. In some embodiments, controller 908 receives instructions to perform programing and/or reading operations on the OTP memory sectors of IC 900 from another controller (not shown), such as another controller external to IC 900, e.g., via a communication interface.

In some embodiments, controller 908 is implemented as a generic or custom controller or processor, e.g., configured to execute instructions from a memory. In some embodiments, controller 908 includes a finite state machine (FSM). Other implementations are also possible.

In some embodiments, secure IC 900 is a stand-alone memory. In some embodiments, secure IC 900 is a secure SoC, such as a secure microcontroller.

In some embodiments, secure IC 900 advantageously provide OTP capabilities without using a poly fuse array.

Figure 10:
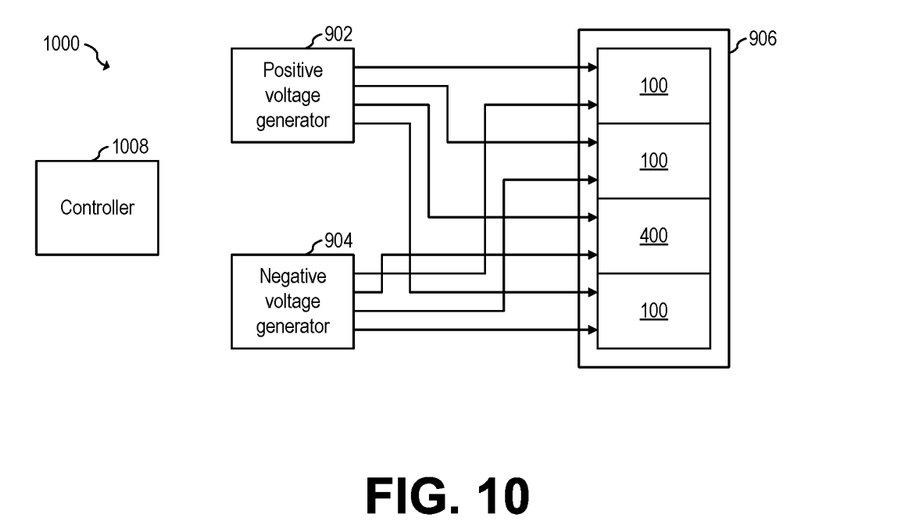
FIG. 10 shows a schematic diagram of a secured IC, according to an embodiment of the present invention.

FIG. 10 shows a schematic diagram of secured IC moo, according to an embodiment of the present invention. IC 1000 operates in a similar manner as IC 900, and includes positive voltage generator 902, negative voltage generator 904, and internal memory 906. IC 1000, however, has a similar or identical layout for all of the memory sectors (including memory sectors implemented with OTP memory cell array 400 and memory sectors implemented with memory cell array 100). As such, and as shown in FIG. 10, memory sectors implemented with OTP memory cell array 400 is coupled to negative voltage generator 904 in a similar manner as memory sectors implemented with memory cell array 100.

Figure 11:
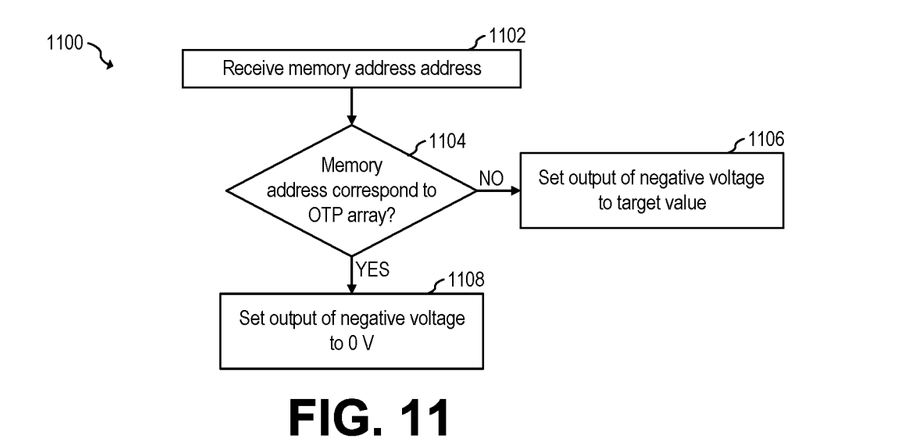
FIG. 11 shows a flow chart of an embodiment method for preventing the erasure of the OTP memory cell array of FIG. 4, according to an embodiment of the present invention.

IC 1000 also includes controller 1008 instead of controller 908. In some embodiments, controller 1008 is implemented and operates in a similar manner as controller 908. Controller 1008, however, prevents the erasure of memory cells 102 located in memory sectors implemented with OTP memory cell array 400 by forcing the voltage at the output of negative voltage generator 904 from a negative voltage to 0 V when OTP memory cell array 400 is accessed (e.g., either for a read or write operation). For example, FIG. 11 shows a flow chart of embodiment method 1100 for preventing erasure of OTP memory cell array 400, according to an embodiment of the present invention. In some embodiments, controller 1008 may implement method 1100.

During step 1102, a memory address (e.g., of internal memory 906) to be accessed (e.g., for read or write) is received (e.g., by controller 1008). If it is determined during step 1104 that the received memory address is associated with an OTP memory cell array 400 (output "yes" from step 1104), then, the output of the negative voltage generator (e.g., 904) is set (during step 1108) to a no-erase voltage (i.e., a voltage that does not cause the erasure of memory cells 102, such as 0 V). Otherwise, if the received memory address is associated with a non-OTP memory cell (e.g., 100), then the output of the negative voltage generator 904 is set to the target voltage, such as −7 V, during step 1106.

In some embodiments, controller 1008 implements method 1100 by design (i.e., cannot be modified by software) so that OTP memory cell array 400 is an ROTP.

Example embodiments of the present invention are summarized here. Other embodiments can also be understood from the entirety of the specification and the claims filed herein.

Example embodiments of the present disclosure are summarized here. Other embodiments can also be understood from the entirety of the specification and the claims filed herein.

Example 1. A method including: receiving a first program bit address, the first program bit address associated with a first plurality of redundant bit addresses, wherein the first program bit address is associated with a first transistor-based memory cell, and wherein the first plurality of redundant bit addresses are each associated with a respective transistor-based memory cell; providing a programing pulse to a first word line coupled to the first transistor-based memory cell to write a first write value to the first transistor-based memory cell; reading a first bit value from the first transistor-based memory cell via a first bit line; reading redundant bit values from transistor-based memory cells associated with the first plurality of redundant bit addresses via respective bit lines; when one of the first bit value and the redundant bit values does not match the first write value, determining a majority bit value based on the first bit value and on the redundant bit values read from the transistor-based memory cells associated with the first plurality of redundant bit addresses; and when the majority bit value does not match the first write value, asserting a flag signal indicative of a failed programing of the first program bit address to the first write value.

Example 2. The method of example 1, where providing the programing pulse to the first word line comprises providing a first positive voltage to the first word line, where the first word line is incapable of receiving a negative voltage.

Example 3. The method of example 1 or 2, where each of the transistor-based memory cells associated with the redundant bit addresses is coupled to a respective word line, the method further comprising, when one of the first bit value and the redundant bit values does not match the first write value, providing an additional programing pulse to the word line associated with the one of the first bit value and the redundant bit values, and where determining the majority bit value comprises determining the majority bit value after providing the additional programing pulse.

Example 4. The method of example 1 to 3, where the first transistor-based memory cell and the transistor-based memory cells associated with the first plurality of redundant bit addresses are part of a one-time programmable (OTP) memory array, the method further includes testing the OTP memory array by programing a first row and a first column of the OTP memory array to the first write value.

Example 5. The method of example 1 and 4, further includes preventing a read operation on the first row and first column of the OTP memory array.

Example 6. The method of example 1 to 5, where the first transistor-based memory cell and the transistor-based memory cells associated with the first plurality of redundant bit addresses are part of a one-time programmable (OTP) memory array sector of a memory, the memory further comprising a non-OTP memory array sector, the method further includes reading a second bit value from a transistor-based memory cell of the non-OTP memory array sector by comparing a current from an associated bit line of the non-OTP memory array sector with an adaptive current threshold, where reading the first bit value from the first transistor-based memory cell via the first bit line comprises comparing a current from the first bit line with a fixed current threshold.

Example 7. The method of examples 1 to 6, where the first transistor-based memory cell and the transistor-based memory cells associated with the first plurality of redundant bit addresses are part of a one-time programmable (OTP) memory array sector of a memory, the memory further comprising a non-OTP memory array sector, the method further includes programing a second bit value to a second transistor-based memory cell of the non-OTP memory array sector by providing a first programing voltage to a second word line associated with the second transistor-based memory cell, where providing the programing pulse to the first word line comprises providing a second programing voltage that is higher than the first programing voltage.

Example 8. The method of examples 1 to 7, where the first transistor-based memory cell and the transistor-based memory cells associated with the first plurality of redundant bit addresses are part of a one-time programmable (OTP) memory array sector of a memory, the memory further comprising a non-OTP memory array sector, the method further includes reading a second bit value from a second transistor-based memory cell of the non-OTP memory array sector by providing a first read voltage to a second word line associated with the second transistor-based memory cell, where reading the first bit value from the first transistor-based memory cell comprises providing a second read voltage to the first transistor-based memory cell that is higher than the first read voltage.

Example 9. The method of examples 1 to 8, where each of the transistor-based memory cells associated with the first program bit address and the first plurality of redundant bit addresses is a multi-bit memory cell.

Example 10. The method of examples 1 to 9, further includes: receiving a plurality of additional program bit addresses, wherein each of the plurality of additional program bit addresses is associated with a respective multi-bit transistor-based memory cell; and programing each of the multi-bit transistor-based memory cells associated with the plurality of additional program bit addresses to the first write value, wherein, after programing each of the multi-bit transistor-based memory cells, each of the bits of each of the multi-bit transistor-based memory cells is programed to the first write value.

Example 11. The method of examples 1 to 10, where the first write value corresponds to a logic 0.

Example 12. The method of examples 1 to 11, where the first transistor-based memory cell and the transistor-based memory cells associated with the first plurality of redundant bit addresses are part of a one-time programmable (OTP) memory array sector of a memory, the memory further comprising a non-OTP memory array sector, the method further includes: receiving a memory address; when the memory address corresponds to a memory cell of the non-OTP memory array, setting an output of a negative voltage generator to a target negative voltage; and when the memory address corresponds to a memory cell of the OTP memory array, setting the output of the negative voltage generator to a no-erase voltage that is different from the target negative voltage.

Example 13. The method of examples 1 to 11, where the no-erase voltage is equal to 0 V.

Example 14. A circuit includes: a plurality of transistor-based memory cells arranged in rows and columns, each transistor-based memory cell comprising first and second bit line terminals coupled to associated bit lines of a plurality of bit lines, and a gate terminal coupled to an associated word line of a plurality of word lines, wherein each word line of the plurality of word lines is coupled to the gate terminals of the transistor-based memory cells of an associated row; and a controller configured to: cause a programing pulse to be provided to a first word line coupled to a first transistor-based memory cell of the plurality of transistor-based memory cells to write a first write value to the first transistor-based memory cell, cause a first bit value to be read from the first transistor-based memory cell via a first bit line, cause redundant bit values to be read from redundant transistor-based memory cells of the plurality of transistor-based memory cells, wherein the redundant transistor-based memory cells are configured to store the same value as the first transistor-based memory cell, when one of the first bit value and the redundant bit values does not match the first write value, determine a majority bit value based on the first bit value and the redundant bit values read from the redundant transistor-based memory cells, and when the majority bit value does not match the first write value, cause a flag signal indicative of a failed programing of the first transistor-based memory cell to the first write value to be asserted.

Example 15. The circuit of example 14, where each transistor-based memory cell of the plurality of transistor-based memory cells comprises a charge trapping material comprising a non-conducting material.

Example 16. The circuit of examples 14 to 15, where the non-conducting material comprises silicon nitride.

Example 17. The circuit of examples 14 to 16, where each transistor-based memory cell of the plurality of transistor-based memory cells is configured to store a single bit of data.

Example 18. The circuit of examples 14 to 17, where each transistor-based memory cell of the plurality of transistor-based memory cells is configured to store multiple bits of data.

Example 19. The circuit of examples 14 and 17 to 18, where each of the multiple bits of the first transistor-based memory cell matches the first write value.

Example 20. The circuit of examples 14 to 19, where a row of transistor-based memory cells and a column of transistor-based memory cells are programmed to the first write value.

Example 21. The circuit of examples 14 to 20, where each of the first transistor-based memory cell and the redundant transistor-based memory cells is coupled to a distinct word line and to distinct bit lines.

Example 22. A non-volatile memory includes: a one-time programmable (OTP) sector comprising a first plurality of transistor-based memory cells arranged in rows and columns, each transistor-based memory cell of the first plurality of transistor-based memory cells comprising first and second bit line terminals coupled to associated bit lines of a first plurality of bit lines, and a gate terminal coupled to an associated word line of a first plurality of word lines; and a non-OTP sector comprising a second plurality of transistor-based memory cells arranged in rows and columns, each transistor-based memory cell of the second plurality of transistor-based memory cells comprising first and second bit line terminals coupled to associated bit lines of a second plurality of bit lines, and a gate terminal coupled to an associated word line of a second plurality of word lines; where the second plurality of word lines is configured to receive a first positive voltage during a read mode, a second positive voltage during a write mode, and a first negative voltage during an erase mode; where the first plurality of word lines is configured to receive a third positive voltage during a read mode, and a fourth positive voltage during a write mode, wherein the first plurality of word lines is designed to not receive a negative voltage during any mode; and where the transistor-based memory cells of the OTP sector and the transistor-based memory cells of the non-OTP sector are of the same type.

Example 23. The non-volatile memory of example 22, where the non-volatile memory lacks a poly fuse array.

Example 24. The non-volatile memory of examples 22 to 23, where the third positive voltage is higher than the first positive voltage, and where the fourth positive voltage is higher than the second positive voltage.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
   receiving a first program bit address, the first program bit address associated with a first plurality of redundant bit addresses, wherein the first program bit address is associated with a first transistor-based memory cell, and wherein the first plurality of redundant bit addresses are each associated with a respective transistor-based memory cell;
   providing a programing pulse to a first word line coupled to the first transistor-based memory cell to write a first write value to the first transistor-based memory cell;
   reading a first bit value from the first transistor-based memory cell via a first bit line;
   reading redundant bit values from transistor-based memory cells associated with the first plurality of redundant bit addresses via respective bit lines;
   when one of the first bit value and the redundant bit values does not match the first write value, determining a majority bit value based on the first bit value and on the redundant bit values read from the transistor-based memory cells associated with the first plurality of redundant bit addresses; and
   when the majority bit value does not match the first write value, asserting a flag signal indicative of a failed programing of the first program bit address to the first write value.

2. The method of claim 1, wherein providing the programing pulse to the first word line comprises providing a first positive voltage to the first word line, wherein the first word line is incapable of receiving a negative voltage.

3. The method of claim 1, wherein each of the transistor-based memory cells associated with the first plurality of redundant bit addresses is coupled to a respective word line, the method further comprising, when one of the first bit value and the redundant bit values does not match the first write value, providing an additional programing pulse to the word line associated with the one of the first bit value and the redundant bit values, and wherein determining the majority bit value comprises determining the majority bit value after providing the additional programing pulse.

4. The method of claim 1, wherein the first transistor-based memory cell and the transistor-based memory cells associated with the first plurality of redundant bit addresses are part of a one-time programmable (OTP) memory array, the method further comprising testing the OTP memory array by programing a first row and a first column of the OTP memory array to the first write value.

5. The method of claim 4, further comprising preventing a read operation on the first row and first column of the OTP memory array.

6. The method of claim 1, wherein the first transistor-based memory cell and the transistor-based memory cells associated with the first plurality of redundant bit addresses are part of a one-time programmable (OTP) memory array sector of a memory, the memory further comprising a non-OTP memory array sector, the method further comprising reading a second bit value from a transistor-based memory cell of the non-OTP memory array sector by comparing a current from an associated bit line of the non-OTP memory array sector with an adaptive current threshold, wherein reading the first bit value from the first transistor-based memory cell via the first bit line comprises comparing a current from the first bit line with a fixed current threshold.

7. The method of claim 1, wherein the first transistor-based memory cell and the transistor-based memory cells associated with the first plurality of redundant bit addresses are part of a one-time programmable (OTP) memory array sector of a memory, the memory further comprising a non-OTP memory array sector, the method further comprising programing a second bit value to a second transistor-based memory cell of the non-OTP memory array sector by providing a first programing voltage to a second word line associated with the second transistor-based memory cell, wherein providing the programing pulse to the first word line comprises providing a second programing voltage that is higher than the first programing voltage.

8. The method of claim 1, wherein the first transistor-based memory cell and the transistor-based memory cells associated with the first plurality of redundant bit addresses are part of a one-time programmable (OTP) memory array sector of a memory, the memory further comprising a non-OTP memory array sector, the method further comprising reading a second bit value from a second transistor-based memory cell of the non-OTP memory array sector by providing a first read voltage to a second word line associated with the second transistor-based memory cell, wherein reading the first bit value from the first transistor-based memory cell comprises providing a second read voltage to the first transistor-based memory cell that is higher than the first read voltage.

9. The method of claim 1, wherein each of the transistor-based memory cells associated with the first program bit address and the first plurality of redundant bit addresses is a multi-bit memory cell.

10. The method of claim 1, further comprising:
receiving a plurality of additional program bit addresses, wherein each of the plurality of additional program bit addresses is associated with a respective multi-bit transistor-based memory cell; and
programing each of the multi-bit transistor-based memory cells associated with the plurality of additional program bit addresses to the first write value, wherein, after programing each of the multi-bit transistor-based memory cells, each bit of each of the multi-bit transistor-based memory cells is programed to the first write value.

11. The method of claim 1, wherein the first write value corresponds to a logic 0.

12. The method of claim 1, wherein the first transistor-based memory cell and the transistor-based memory cells associated with the first plurality of redundant bit addresses are part of a one-time programmable (OTP) memory array sector of a memory, the memory further comprising a non-OTP memory array sector, the method further comprising:
receiving a memory address;
when the memory address corresponds to a memory cell of the non-OTP memory array sector, setting an output of a negative voltage generator to a target negative voltage; and
when the memory address corresponds to a memory cell of the OTP memory array sector, setting the output of the negative voltage generator to a no-erase voltage that is different from the target negative voltage.

13. The method of claim 12, wherein the no-erase voltage is equal to 0 V.

14. A circuit comprising:
a plurality of transistor-based memory cells arranged in rows and columns, each transistor-based memory cell comprising first and second bit line terminals coupled to associated bit lines of a plurality of bit lines, and a gate terminal coupled to an associated word line of a plurality of word lines, wherein each word line of the plurality of word lines is coupled to the gate terminals of the transistor-based memory cells of an associated row; and
a controller configured to:
cause a programing pulse to be provided to a first word line coupled to a first transistor-based memory cell of the plurality of transistor-based memory cells to write a first write value to the first transistor-based memory cell,
cause a first bit value to be read from the first transistor-based memory cell via a first bit line of the plurality of bit lines,
cause redundant bit values to be read from redundant transistor-based memory cells of the plurality of transistor-based memory cells, wherein the redundant transistor-based memory cells are configured to store the same value as the first transistor-based memory cell,
when one of the first bit value and the redundant bit values does not match the first write value, determine a majority bit value based on the first bit value and the redundant bit values read from the redundant transistor-based memory cells, and
when the majority bit value does not match the first write value, cause a flag signal indicative of a failed programing of the first transistor-based memory cell to the first write value to be asserted.

15. The circuit of claim 14, wherein each transistor-based memory cell of the plurality of transistor-based memory cells comprises a charge trapping material comprising a non-conducting material.

16. The circuit of claim 15, wherein the non-conducting material comprises silicon nitride.

17. The circuit of claim 14, wherein each transistor-based memory cell of the plurality of transistor-based memory cells is configured to store a single bit of data.

18. The circuit of claim 14, wherein each transistor-based memory cell of the plurality of transistor-based memory cells is configured to store multiple bits of data.

19. The circuit of claim 18, wherein each of the multiple bits of the first transistor-based memory cell matches the first write value.

20. The circuit of claim 14, wherein a row of transistor-based memory cells and a column of transistor-based memory cells are programmed to the first write value.

21. The circuit of claim 14, wherein each of the first transistor-based memory cell and the redundant transistor-based memory cells is coupled to a distinct word line and to distinct bit lines.

22. A non-volatile memory comprising:
a one-time programmable (OTP) memory sector comprising a first plurality of transistor-based memory cells arranged in rows and columns, each transistor-based memory cell comprising first and second bit line terminals coupled to associated bit lines of a plurality of bit lines, and a gate terminal coupled to an associated word line of a plurality of word lines, wherein each word line of the plurality of word lines is coupled to the gate terminals of the transistor-based memory cells of an associated row; and
a controller configured to:
cause a programing pulse to be provided to a first word line coupled to a first transistor-based memory cell of the plurality of transistor-based memory cells to write a first write value to the first transistor-based memory cell,
cause a first bit value to be read from the first transistor-based memory cell via a first bit line of the plurality of bit lines,
cause redundant bit values to be read from redundant transistor-based memory cells of the plurality of transistor-based memory cells, wherein the redundant transistor-based memory cells are configured to store the same value as the first transistor-based memory cell,
when one of the first bit value and the redundant bit values does not match the first write value, determine a majority bit value based on the first bit value and the redundant bit values read from the redundant transistor-based memory cells, and when the majority bit value does not match the first write value, cause a flag signal indicative of a failed programing of the first transistor-based memory cell to the first write value to be asserted.

23. The non-volatile memory of claim 22, further including a non-OTP memory sector comprising a second plurality of transistor-based memory cells arranged in rows and columns, each transistor-based memory cell of the second plurality of transistor-based memory cells comprising first and second bit line terminals coupled to associated bit lines of a second plurality of bit lines, and a gate terminal coupled to an associated word line of a second plurality of word lines, wherein the controller is further configured to:
  read a second bit value from a second transistor-based memory cell of the second plurality of transistor-based memory cells of the non-OTP memory sector by providing a first read voltage to a word line of the second plurality of word lines associated with the second transistor-based memory cell, wherein causing the first bit value to be read from the first transistor-based memory cell comprises providing a second read voltage to the first transistor-based memory cell that is higher than the first read voltage.

24. The non-volatile memory of claim 22, wherein each transistor-based memory cell of the plurality of transistor-based memory cells comprises a charge trapping material comprising a non-conducting material.

* * * * *